United States Patent
Hu et al.

(10) Patent No.: US 9,673,131 B2
(45) Date of Patent: Jun. 6, 2017

(54) INTEGRATED CIRCUIT PACKAGE ASSEMBLIES INCLUDING A GLASS SOLDER MASK LAYER

(71) Applicant: Intel Corporation, Santa Clara, CA (US)

(72) Inventors: Chuan Hu, Chandler, AZ (US); Qing Ma, Saratoga, CA (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/859,659

(22) Filed: Apr. 9, 2013

(65) Prior Publication Data

US 2014/0299999 A1    Oct. 9, 2014

(51) Int. Cl.
*H01L 23/52* (2006.01)
*H01L 23/48* (2006.01)
(Continued)

(52) U.S. Cl.
CPC ............ *H01L 23/481* (2013.01); *H01L 21/56* (2013.01); *H01L 21/561* (2013.01); *H01L 24/19* (2013.01); *H01L 24/96* (2013.01); *H01L 25/0652* (2013.01); *H01L 21/568* (2013.01); *H01L 23/3128* (2013.01); *H01L 2224/04105* (2013.01); *H01L 2224/12105* (2013.01); *H01L 2224/16227* (2013.01); *H01L 2224/16235* (2013.01); *H01L 2224/24137* (2013.01); *H01L 2224/73209* (2013.01); *H01L 2224/81005* (2013.01); *H01L 2224/92133* (2013.01); *H01L 2924/15192* (2013.01);
(Continued)

(58) Field of Classification Search
CPC ....... H01L 23/5226; H01L 2924/01078; H01L 2924/01079; H01L 23/481; H01L 2924/01029
USPC ....... 438/629, 637, 639, 640, 667, 668, 672, 438/675, 700, 701, 713, 978; 257/774
See application file for complete search history.

(56) References Cited

U.S. PATENT DOCUMENTS 5,667,934 A * 9/1997 Markovich et al. ....... 430/280.1
8,227,904 B2 7/2012 Braunisch et al.
(Continued)

FOREIGN PATENT DOCUMENTS

WO    2010151350    12/2010

OTHER PUBLICATIONS

Office Action and Search Report mailed Sep. 9, 2015 for Taiwanese Application No. 103112138, 11 pages.

*Primary Examiner* — John C Ingham
*Assistant Examiner* — Didarul Mazumder
(74) *Attorney, Agent, or Firm* — Schwabe, Williamson & Wyatt, P.C.

(57) ABSTRACT

Embodiments of the present disclosure are directed towards techniques and configurations for integrated circuit package assemblies including a glass solder mask layer and/or bridge. In one embodiment, an apparatus includes one or more build-up layers having electrical routing features and a solder mask layer composed of a glass material, the solder mask layer being coupled with the one or more build-up layers and having openings disposed in the solder mask layer to allow coupling of package-level interconnect structures with the electrical routing features through the one or more openings. Other embodiments may be described and/or claimed.

17 Claims, 8 Drawing Sheets

(51) Int. Cl.
  *H01L 21/56*   (2006.01)
  *H01L 23/00*   (2006.01)
  *H01L 25/065*  (2006.01)
  *H01L 23/31*   (2006.01)

(52) U.S. Cl.
  CPC ............ *H01L 2924/15311* (2013.01); *H01L 2924/15313* (2013.01); *H01L 2924/181* (2013.01); *H01L 2924/18161* (2013.01); *H01L 2924/18162* (2013.01)

(56) References Cited

U.S. PATENT DOCUMENTS

| | | | |
|---|---|---|---|
| 8,273,671 | B2 | 9/2012 | Leib et al. |
| 2002/0182832 | A1* | 12/2002 | Farquhar et al. ............ 438/584 |
| 2002/0185734 | A1* | 12/2002 | Zhao et al. .................. 257/737 |
| 2003/0151067 | A1* | 8/2003 | Iijima et al. ................. 257/200 |
| 2004/0113644 | A1* | 6/2004 | Wood et al. ................. 324/754 |
| 2004/0200062 | A1* | 10/2004 | Siegel et al. .................... 29/827 |
| 2007/0096327 | A1 | 5/2007 | Kawamura et al. |
| 2008/0006945 | A1 | 1/2008 | Lin et al. |
| 2009/0020591 | A1* | 1/2009 | Sakaguchi ........... B23K 1/0016 228/180.22 |
| 2011/0193220 | A1* | 8/2011 | Kuo ....................... H01L 24/11 257/737 |
| 2011/0227214 | A1* | 9/2011 | Tateiwa et al. ............... 257/734 |
| 2012/0146209 | A1 | 6/2012 | Hu et al. |
| 2012/0161331 | A1* | 6/2012 | Gonzalez et al. ............ 257/774 |
| 2012/0235278 | A1* | 9/2012 | Shigihara et al. ............ 257/532 |
| 2012/0261838 | A1 | 10/2012 | Braunisch et al. |

\* cited by examiner

INTEGRATED CIRCUIT PACKAGE ASSEMBLIES INCLUDING A GLASS SOLDER MASK LAYER

FIELD

Embodiments of the present disclosure generally relate to the field of integrated circuits, and more particularly, to techniques and configurations for integrated circuit package assemblies including a glass solder mask layer.

BACKGROUND

Currently, integrated circuit (IC) package assemblies may include a solder mask layer composed of polymer as an outermost layer of a package substrate to facilitate formation of second-level or "package-level" interconnects. However, present polymer-based solder mask layers may be associated with higher loss and/or cross-talk resulting in lower power efficiency for electrical signals routed through the second-level interconnects. Cleaning of build-up layers of the package substrate may be difficult in current processes that utilize a polymer-based solder mask layer. Additionally, forming openings in the polymer-based solder mask layer may be costly.

Emerging IC package assemblies may further include a bridge configured to route electrical signals between dies mounted on the IC package assembly. Current techniques to align and/or couple the bridge with the IC package assembly may be costly or may not be capable of fabricating fine line and space and provide high input/output (I/O) count between dies or may be otherwise challenging owing to constraints in temporary position alignment technology and/or differences in coefficient of thermal expansion (CTE) between the bridge and other materials of the IC package assembly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for integrated circuit package assemblies including a glass solder mask layer and/or bridge. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Figure 1:
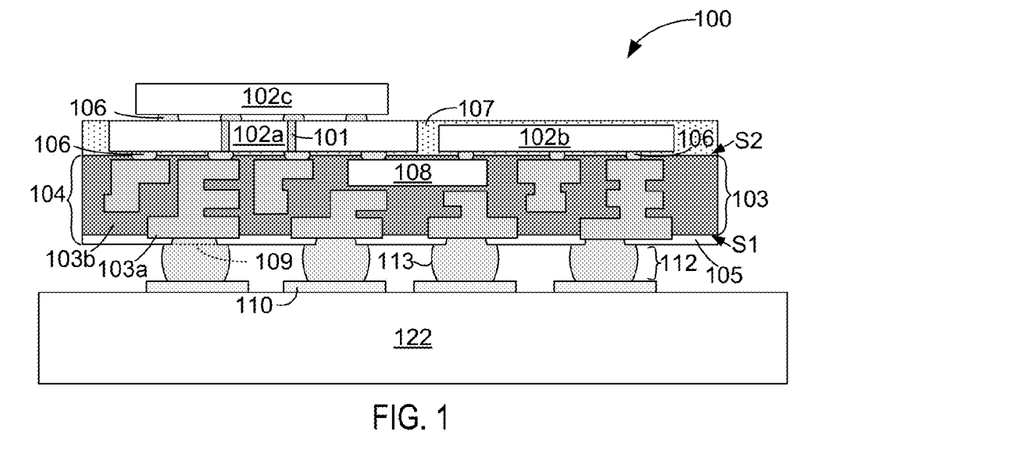
FIG. 1 schematically illustrates a cross-section side view of an example integrated circuit (IC) package assembly, in accordance with some embodiments.

FIG. 1 schematically illustrates a cross-section side view of an example integrated circuit (IC) package assembly 100, in accordance with some embodiments. In some embodiments, the IC package assembly 100 may include a package substrate 104 coupled with one or more dies (e.g., dies 102a, 102b and 102c) and circuit board 122, as can be seen. In various embodiments, the IC package assembly 100 may refer to only the package substrate 104.

In some embodiments, the dies 102a, 102b may be mounted on or attached to the package substrate 104 according to a wide variety of suitable configurations including, for example, being directly coupled with the package substrate 104 in a flip-chip configuration, as depicted. In the flip-chip configuration, an active side of the dies 102a, 102b is attached to a surface of the package substrate 104 using die interconnect structures 106 such as bumps, pillars, bonding pads or other suitable structures that may also electrically couple the dies 102a, 102b with the package substrate 104. The active side of the dies 102a, 102b and 102c may include a plurality of active integrated circuit (IC) devices such as, for example, transistor devices. In some embodiments, the dies 102a, 102b are configured in a side-by-side arrangement on the package substrate 104, as can be seen.

In some embodiments, a die 102c may be coupled with die 102a in a stacked flip-chip configuration, as can be seen. The die 102a may include one or more through-silicon vias (TSVs) 101 that are configured to route electrical signals of the die 102c between the die 102c and the package substrate 104 through the die 102a. Electrical signals of the dies 102a, 102b and 102c may be routed between the dies 102a, 102b and 102c and the package substrate 104 through the die interconnect structures 106. In some embodiments, the electrical signals include input/output (I/O) signals and/or power/ground associated with operation of the dies 102a, 102b and 102c. Each of the dies 102a, 102b and 102c may represent a discrete unit made from a semiconductor material using semiconductor fabrication techniques such as thin film deposition, lithography, etching and the like. In some embodiments, the dies 102a, 102b and 102c may be, include, or be a part of a processor, memory, system on chip (SoC) or ASIC in some embodiments. In one embodiment, the die 102a is a processor and at least one of dies 102b or 102c is memory. The dies 102a, 102b and 102c may be configured to serve other functions in other embodiments.

In some embodiments, an electrically insulative material 107 such as, for example, molding compound or underfill material (not shown) may encapsulate at least a portion of one or more of the dies 102a, 102b and 102c. In the depicted example of FIG. 1, the die 102a is partially encapsulated by the electrically insulative material 107, the die 102b is fully encapsulated by the electrically insulative material 107 and the die 102c is not encapsulated (e.g., in direct contact with) by the electrically insulative material 107 at all. The IC package assembly 100 may include other suitable configurations of the electrically insulative material 107 in other embodiments.

In some embodiments, the electrically insulative material 107 may include an underfill material between the dies 102a, 102b and 102c and the package substrate 104 and a molding compound disposed on inactive surfaces of the dies 102a, 102b and 102c. In other embodiments, the electrically insulative material 107 may include a molding underfill material that is disposed between the dies 102a, 102b and 102c and the package substrate 104 and on inactive surfaces of the dies 102a, 102b and 102c. The electrically insulative material 107 may include, for example, epoxy-based materials including suitable filler materials.

The package substrate 104 may include one or more build-up layers (hereinafter "build-up layers 103") having electrical routing features 103a disposed in an electrically insulative material 103b or dielectric material. Although three build-up layers 103 are depicted in the example of FIG. 1, the package substrate 104 may include more or fewer build-up layers in other embodiments. In some embodiments, the build-up layers may include bumpless build-up layers.

The electrical routing features 103a may include metal (e.g., copper) structures such as, for example, traces, trenches, vias, lands, pads or other structures that provide corresponding electrical pathways for electrical signals of the dies 102a, 102b and 102c through the package substrate 104 (e.g., from side S2 to side S1). In some embodiments, the electrical pathways may be arranged in a fanout configuration.

In some embodiments, the package substrate 104 is an epoxy-based laminate substrate having a core and/or build-up layers such as, for example, an Ajinomoto Build-up Film (ABF) substrate. The electrically insulative material 103b may be an organic material in some embodiments. The package substrate 104 may include other suitable types of substrates or materials in other embodiments.

According to various embodiments, the package substrate 104 includes a solder mask layer 105 composed of a glass material. In some embodiments, the solder mask layer 105 is disposed on side S1 of the build-up layers 103, which is disposed opposite to side S2 of the build-up layers 103 as can be seen. The glass material of the solder mask layer 105 may include, for example, silica, quartz, nano fiber enhanced glass/organic or other similar glass materials. In some embodiments, the solder mask layer 105 has a thickness of the glass material ranging from 15 to 50 microns in a direction (e.g., up and down in FIG. 1) that is substantially perpendicular to a plane formed by the solder mask layer 105. The glass material may include other suitable materials or thicknesses in other embodiments.

The glass material of the solder mask layer 105 may be optically transparent at a wavelength of light within the visible spectrum (e.g., from 390 nanometers (nm) to 700 nm) to facilitate alignment of the package substrate 104 during formation of the package-level interconnect structures 112 or attachment of the package substrate 104 with another electrical component (e.g., circuit board 122). In some embodiments, alignment feature(s) such as, for example, the electrical routing features 103a (e.g., a via pit), may be visible on a side S1 of the one or more build-up layers 103 through the solder mask layer 105. A camera can be used to capture one or more images of the alignment feature(s) to facilitate alignment of the package substrate 104 for assembly processing.

In some embodiments, the glass material of the solder mask layer 105 may have a coefficient of thermal expansion (CTE) from 1 to 10. In one embodiments, the CTE of the glass material is from 3 to 7. In embodiments where the dies 102a, 102b and 102c are composed of silicon (Si) or other material having a CTE that is closely matched with the CTE of the glass material, the CTE of the solder mask layer 105 may be more closely matched to the CTE of the dies 102a, 102b and 102c than a solder mask layer composed of polymer material, which may reduce warpage or other thermal processing defects of the IC package assembly 100. In some embodiments, a CTE of the solder mask layer 105 may be selected to match a CTE of other components of the package substrate 104 such as, for example, electrically insulative material 107 or build-up layers 103 to mitigate thermal warpage effects.

In some embodiments, the solder mask layer 105 includes one or more openings (e.g., opening 109) that allow coupling of package-level interconnect structures 112 (e.g., solder balls 113) with the electrical routing features 103a through the openings. The openings may have a diameter (e.g., a critical dimension (CD)) that is about 200 microns (e.g., ranging from 100 microns to 300 microns) in some embodiments. A pitch between at least two individual openings of the one or more openings may be less than or equal to 400 microns. The pitch may be uniform between adjacent openings in some embodiments. Other values for diameter, CD or pitch can be used in other embodiments.

Using glass material for the solder mask layer 105 may be less costly to fabricate than using polymer material for the solder mask layer. The glass material may reduce a moisture update (e.g., provide greater barrier to undesirable moisture in the package substrate 104) of the package substrate 104 relative to a polymer solder mask layer. Additionally, the glass material of the solder mask layer 105 may reduce loss or cross-talk of the electrical signals relative to a solder mask layer composed of polymer material and, thus, increase power efficiency for the electrical signals in the IC package assembly 100.

The solder mask layer 105 may be an outermost layer of the package substrate 104 that is configured to protect the build-up layers 103 and facilitate formation of the package-level interconnect structures 112 to couple the package substrate with other electrical components such as, for example, circuit board 122.

In some embodiments, the package substrate 104 may further include a bridge interconnect structure (hereinafter "bridge 108") electrically coupled with the dies 102a and 102b through die interconnect structures 106 and configured to route electrical signals between dies 102a and 102b. The bridge 108 may be composed of glass or a semiconductor material (e.g., Si) and include electrical routing features (not shown) to route the electrical signals. The bridge 108 may be disposed in or within a plane formed by the build-up layers 103. For example, as can be seen in the depicted embodiment, the bridge 108 is embedded in the build-up layers 103. In other embodiments, the bridge 108 may be disposed in a plane formed by the build-up layers 103, but formed separately from the build-up layers 103, as can be seen for example in FIG. 3g. In some embodiments, the package substrate 104 may not include a bridge 108 at all. In other embodiments, the package substrate 104 may include the bridge 108 and a solder mask layer composed of a polymer material.

The IC package assembly 100 may further include package-level interconnect structures 112 (e.g., second-level interconnects) coupled with the package substrate 104 through the openings (e.g., opening 109) in the solder mask layer 105. In some embodiments, the package-level interconnect structures 112 include ball-grid array (BGA) structures such as, for example, solder balls 113. In other embodiments, the package-level interconnect structures 112 include land-grid array (LGA) structures (e.g., LGA structures 213 of FIG. 2g). The package-level interconnect structures 112 may include other suitable interconnect structures in other embodiments.

The package substrate 104 may be coupled with a circuit board 122 in some embodiments. The package-level interconnect structures 112 may be coupled with one or more pads 110 or analogous structures of the circuit board 122 to route electrical signals of the dies 102a, 102b and 102c between the package substrate 104 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 104 with the circuit board 122 may be used in other embodiments.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias, etc. may be formed through the electrically insulating layers to route the electrical signals of the dies 102a, 102b and 102c through the circuit board 122. The circuit board 122 may be composed of other suitable materials in other embodiments. In some embodiments, the circuit board 122 is a motherboard (e.g., motherboard 602 of FIG. 6).

The IC package assembly 100 may include components configured in a wide variety of other suitable configurations in other embodiments including, for example, suitable combinations of flip-chip and/or wire-bonding configurations, use of interposers, multi-chip package configurations including system-in-package (SiP) and/or package-on-package (PoP) configurations to route electrical signals between the dies 102a, 102b and 102c and other components of the IC package assembly 100 in some embodiments.

FIGS. 2a-g schematically illustrate various stages of fabrication of an example IC package assembly 200 including a solder mask layer 105 composed of a glass material, in accordance with some embodiments. The IC package assembly 200 may be fabricated using the solder mask layer 105 as a substrate for fabrication of the build-up layers 103 on the solder mask layer 105.

Figure 2A:
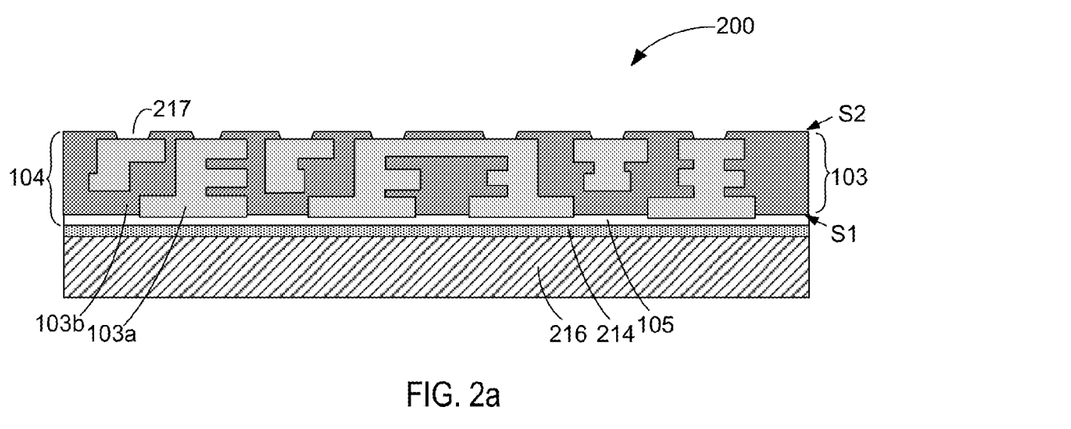
FIGS. 2a-g schematically illustrate various stages of fabrication of an example IC package assembly including a solder mask layer composed of a glass material, in accordance with some embodiments.

FIG. 2a depicts the IC package assembly subsequent to coupling the solder mask layer 105 with a temporary carrier and forming build-up layers 103 on the solder mask layer 105, which serves as a substrate (e.g., core layer) during formation of the build-up layers 103. In some embodiments, the solder mask layer 105 includes a sheet of glass that is bonded to a temporary carrier 216 using adhesive layer 214.

Subsequent to coupling the solder mask layer 105 with the temporary carrier 216, build-up layers 103 may be formed on the solder mask layer 105 using any suitable process. For example, the build-up layers 103 may be formed by depositing a metal, roughening a surface of the metal, depositing a seed layer, depositing photoresist on the seed layer, patterning the photoresist (e.g., using lithography) to provide designated circuitry (e.g., electrical routing features 103a) of the metal layer, depositing metal on the seed layer by electroplating process, removing the photoresist, etching the seed layer and depositing a dielectric material (e.g., electrically insulative material 103b) on the patterned metal layer (e.g., by spin-on, chemical vapor deposition (CVD) or laminate processes. The build-up layers 103 may be formed using other techniques in other embodiments.

The temporary carrier 216 may include any suitable material to structurally support the fabrication of the build-up layers 103 on the solder mask layer 105. In some embodiments, the material of the temporary carrier 216 is selected to have a CTE that matches a CTE of components of the IC package assembly 200 such as, for example, the solder mask layer 105, the build-up layers 103, the dies (e.g., dies 102a, 102b of FIG. 2c) and/or electrically insulative material (e.g., electrically insulative material 107 of FIG. 2e) to reduce or mitigate warpage effects.

The material of the adhesive layer 214 may include any suitable adhesive configured to withstand processes associated with fabrication of the build-up layers 103. For example, in an embodiment where a thermal process is used to cure the electrically insulative material 103b of the build-up layers 103, the material of the adhesive layer 214 may be selected such that the material of the adhesive layer 214 does not interfere with curing of the build-up layers 103. In some embodiments, openings 217 may be formed in the electrically insulative material 103b using any suitable technique to expose portions of the electrical routing features 103a, thereby allowing die attachment to the electrical routing features 103a.

Figure 2B:
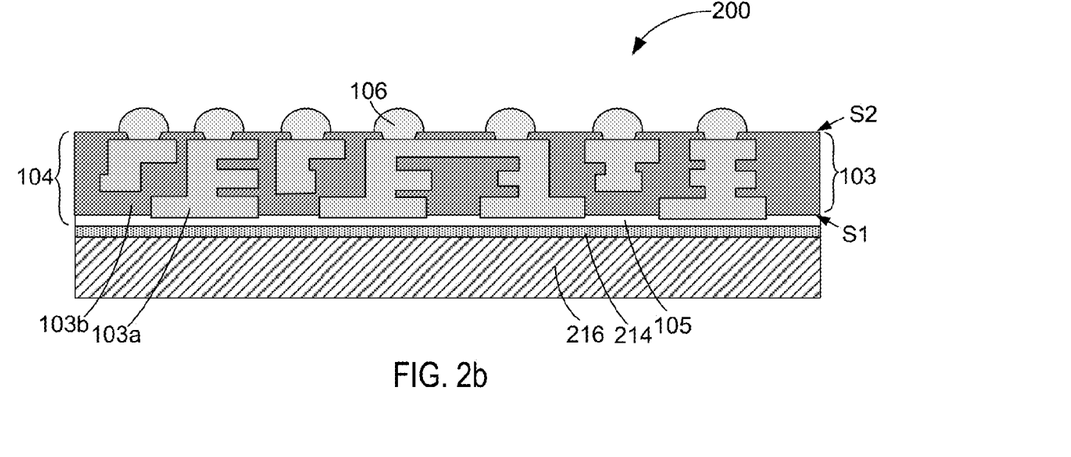

FIG. 2b depicts the IC package assembly 200 subsequent to forming die interconnect structures 106 electrically coupled with the electrical routing features 103a. The die interconnect structures 106 may include, for example, bumps or pillars formed in the openings 217 of FIG. 2a in some embodiments. In other embodiments, the die interconnect structures 106 may be coupled with one or more dies prior to attaching the die(s) to the package substrate 104.

Figure 2C:
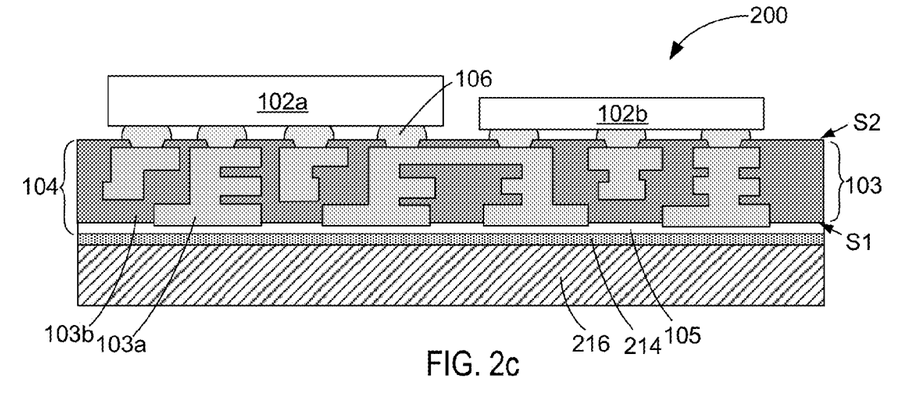

FIG. 2c depicts the IC package assembly 200 subsequent to attaching dies 102a and 102b to the package substrate 104 using the die interconnect structures 106. In some embodiments, the dies 102a and 102b may be attached to the package substrate 104 using a reflow process to form joints of solderable material between the dies 102a, 102b and the package substrate 104. A single reflow process may be used to simultaneously couple the dies 102a, 102b with the package substrate 104 in some embodiments. In other embodiments, a thermocompression bonding (TCB) technique may be used to attach the dies 102a, 102b to the package substrate 104. The package substrate 104 may be bonded with the dies 102a, 102b using a panel-level bonding process (e.g., for higher throughput) or wafer-level bonding process, according to various embodiments.

Figure 2D:
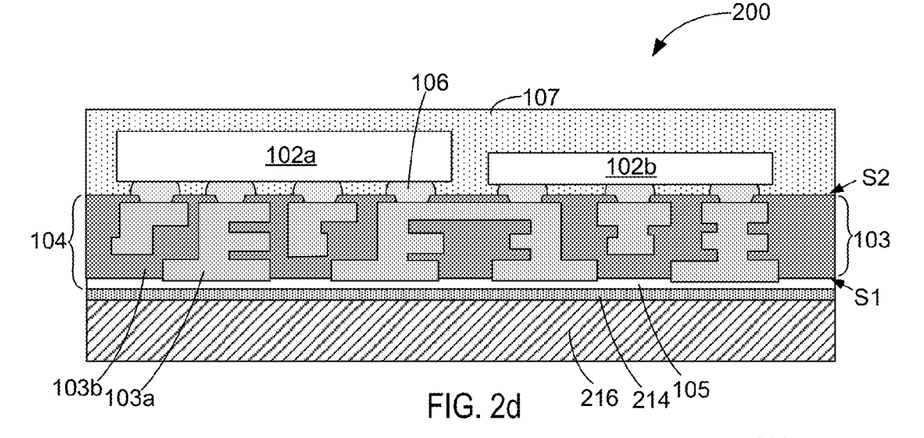

FIG. 2d depicts the IC package assembly 200 subsequent to depositing an electrically insulative material 107 (e.g., molding compound or underfill material) to at least partially encapsulate one or more dies 102a and 102b. In the depicted embodiment, the deposited electrically insulative material 107 fully encapsulates both dies 102a and 102b.

Figure 2E:
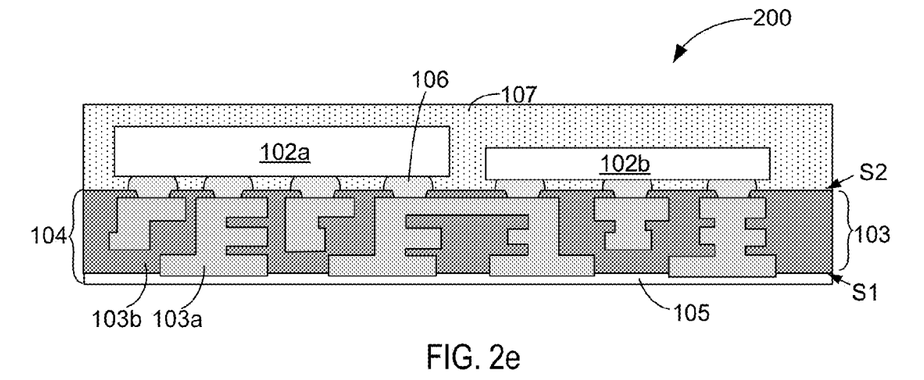

FIG. 2e depicts the IC package assembly 200 subsequent to decoupling the temporary carrier 216 and the package substrate 104. In some embodiments, decoupling the temporary carrier 216 may be performed by using a thermal process to provide a temperature that causes the adhesive layer 214 to lose tackiness. For example, the adhesive layer 214 may be elevated to a temperature above a glass transition (Tg) temperature of the adhesive layer 214 and the IC package assembly 200 may slide off the temporary carrier. Any residual material from the adhesive layer 214 or previous assembly processing may be removed by a cleaning process performed on exposed surfaces of the solder mask layer 105. Other suitable mechanisms or techniques to decouple the temporary carrier 216 and the solder mask layer 105 may be used in other embodiments.

Figure 2F:
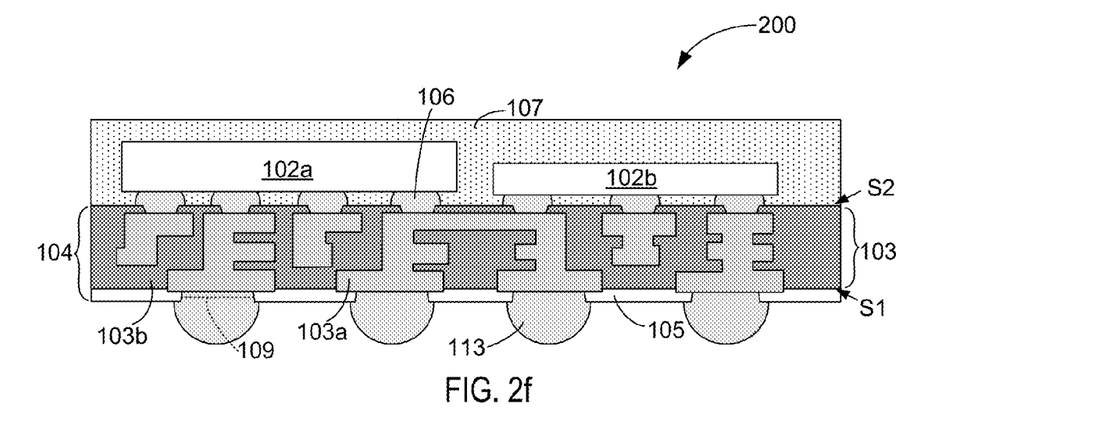

FIG. 2f depicts the IC package assembly 200 subsequent to forming openings (e.g., opening 109) in the solder mask layer and forming BGA structures (e.g., solder balls 113) in the openings. The openings may be formed by any suitable technique including, for example, a wet etch process that is configured to remove the glass material and is selective to the material (e.g., copper) of the underlying electrical routing features 103a.

Figure 2G:
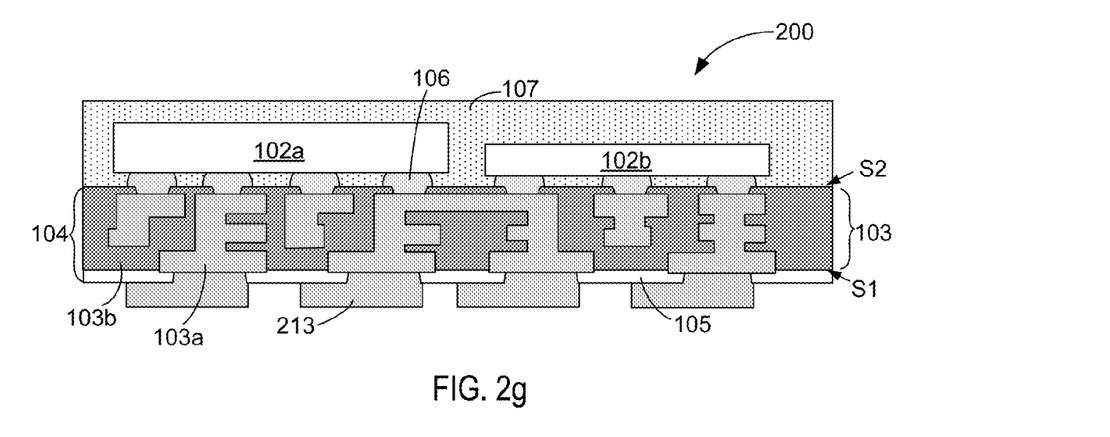

FIG. 2g depicts an alternative to FIG. 2f. In FIG. 2g, the IC package assembly 200 is depicted subsequent to forming openings similar to FIG. 2f and after forming LGA structures 213 in the openings. The LGA structures 213 may be formed by depositing material into the openings to fill the vias and depositing and/or patterning additional material on the filled vias to form the LGA structures 213. Other suitable techniques may be used to form the BGA or LGA structures.

In some embodiments, the fabrication of the IC package assembly 200 may further include forming a bridge (e.g., bridge 108 of FIG. 1) disposed in a plane of the build-up layers 103. The bridge may be formed, for example, by embedding the bridge in build-up layers 103 (e.g., a final build-up layer) as part of the formation of the build-up layers 103 or forming a cavity in the build-up layers 103 and placing bridge in the cavity subsequent to formation of the build-up layers, according to any suitable technique. The bridge may be formed during fabrication described in connection with FIG. 2a prior to attaching the die interconnect structures 106 or dies 102a, 102b.

FIGS. 3a-h schematically illustrate various stages of fabrication of an example IC package assembly 300 including a bridge (e.g., bridge 108 of FIG. 1), in accordance with some embodiments. The IC package assembly 300 may be fabricated by attaching dies to a die attach film, molding the dies and using the molding compound, dies and die attach film as a substrate for fabrication of build-up layers and the bridge.

Figure 3A:
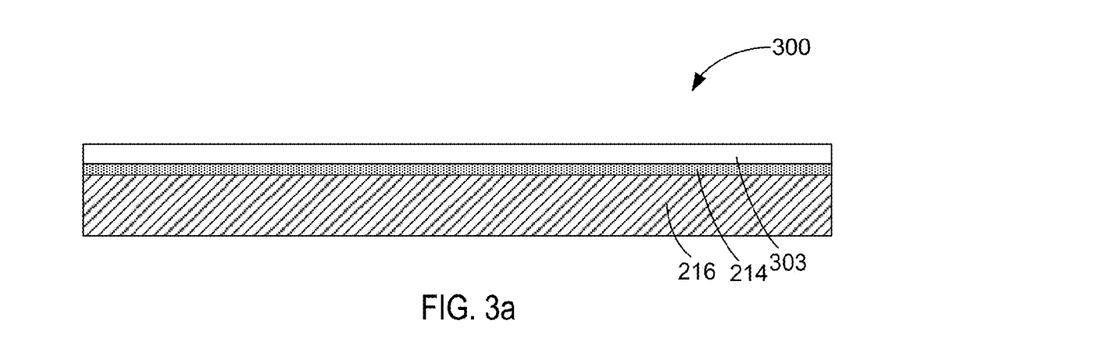
FIGS. 3a-h schematically illustrate various stages of fabrication of an example IC package assembly including a bridge, in accordance with some embodiments.

FIG. 3a depicts the IC package assembly 300 subsequent to coupling a die attach film 303 with a temporary carrier 216 using adhesive layer 214. In some embodiments, the die attach film 303 may be composed of an uncured or not fully cured polymer material including, for example, an epoxy-based material with filler. In some embodiments, the die attach film 303 may be composed of an organic laminate material. In one embodiment, the die attach film 303 is composed of a same or similar material as build-up layers (e.g., build-up layers 103 of FIG. 1 or 3f). The adhesive layer may be thermally and/or mechanically releasable according to various embodiments.

Figure 3B:
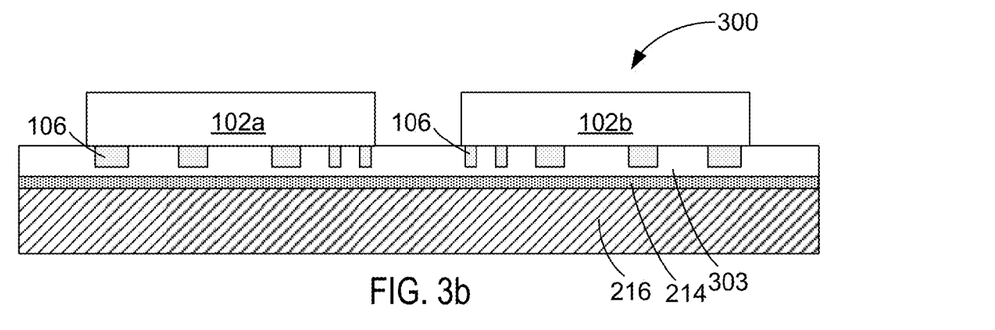

FIG. 3b depicts the IC package assembly 300 subsequent to placing dies 102a, 102b on the die attach film 303 and curing the die attach film 303. In some embodiments, die interconnect structures 106 are formed on the dies 102a, 102b prior to placing the dies 102a, 102b on the die attach film 303. Curing the die attach film 303 may increase adhesion between the dies 102a, 102b and the die attach film 303. A shortest distance between the dies 102a, 102b may range from 50 microns to 100 microns in some embodiments. The shortest distance between the dies 102a, 102b may have other values in other embodiments.

In some embodiments, the die attach film 303 may be composed of anisotropically conductive material such as, for example, electrical ACF (anisotropic conductive film) with a conductive filler phase to provide an anistropic conductive film. In embodiments, the anisotropic conductive film may be used to route electrical signals through the die attach film 303 (e.g., to/from dies 102a, 102b) instead of die interconnect structures 106.

Figure 3C:
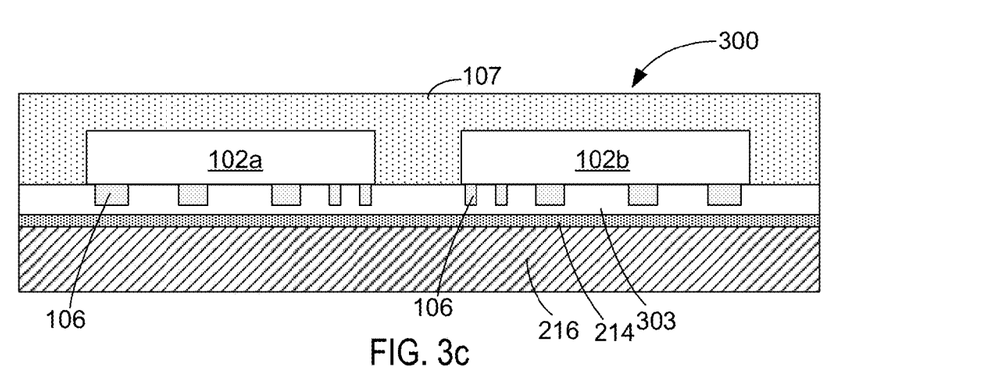

FIG. 3c depicts the IC package assembly 300 subsequent to depositing an electrically insulative material 107 (e.g., molding compound) on the dies 102a, 102b and the die attach film 303, as can be seen. In some embodiments, the electrically insulative material 107 is deposited to fully encapsulate the dies 102a, 102b as depicted. In other embodiments, the electrically insulative material 107 is deposited to partially encapsulate the dies 102a, 102b (e.g., leaving an inactive side of the dies exposed).

Figure 3D:
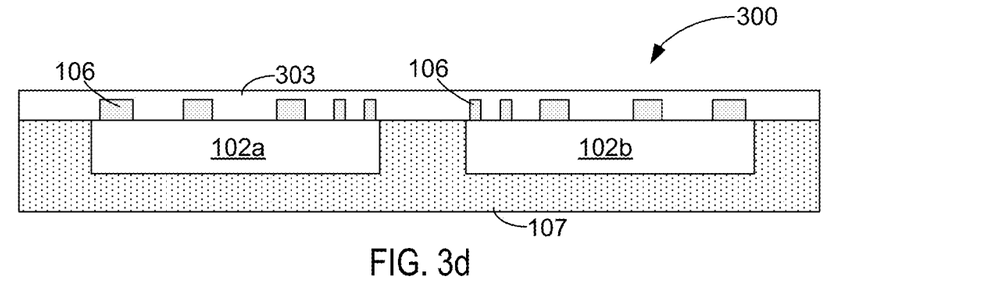

FIG. 3d depicts the IC package assembly 300 subsequent to decoupling the die attach film 303 from the temporary carrier 216. The IC package assembly 300 may be flipped (e.g., oriented about 180 degrees relative to a position of the IC package assembly 300 during processing of FIGS. 3a-c) and cleaned. For example, the die attach film 303 may be cleaned to remove residue of the adhesive layer 214 or other contaminants associated with assembly process.

Figure 3E:
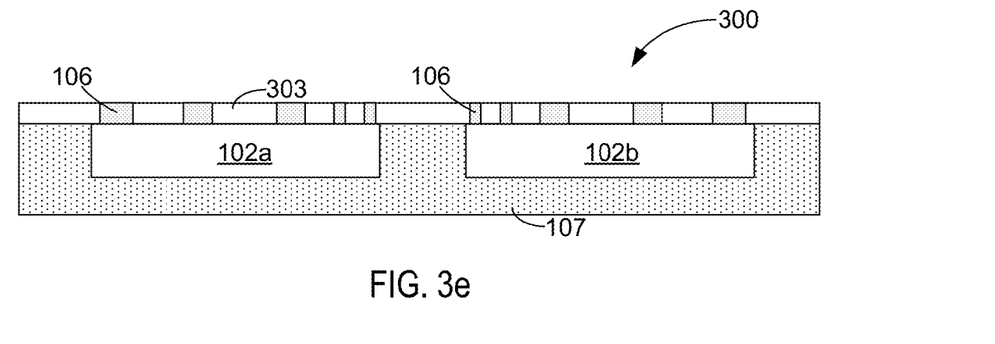

FIG. 3e depicts the IC package assembly 300 subsequent to recessing the die attach film 303 to expose the die interconnect structures 106. The die attach film 303 may be recessed by grinding or planarizing process such as, for example, chemical-mechanical polish (CMP). Other suitable techniques to recess the die attach film 303 may be used in other embodiments.

Figure 3F:
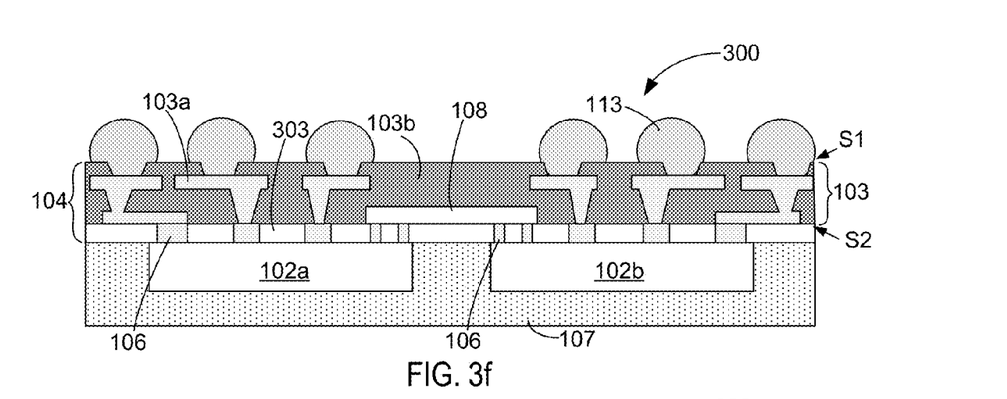

FIG. 3f depicts the IC package assembly 300 subsequent to coupling a bridge 108 with the dies 102a, 102b, forming build-up layers 103 on the die attach film 303 to form a package substrate 104 with electrical routing features 103a through electrically insulative material 103b and forming package-level interconnect structures (e.g., solder balls 113) on the build-up layers 103. The bridge 108 may be attached to die interconnect structures 106 (e.g., by TCB, conductive underfill or reflow process) and a laminate layer of electrically insulative material 103b may be deposited on the bridge 108 and patterned to allow formation of electrical routing features 103a through the electrically insulative material 103b. For example, metal may be deposited in the patterned laminate layer to provide a first build-up layer of the build-up layers 103. Multiple layers of laminate material and/or metal may be deposited to form multiple build-up layers of the build-up layers 103.

In the depicted embodiment, the die attach film 303 serves as a substrate upon which the build-up layers 103 are formed. As previously described, the die attach film 303 may be a same material as the electrically insulative material 103b. In this regard, the die attach film 303 may be considered to be part of the build-up layers 103 of the package substrate 104 in some embodiments. In an embodiment where the die attach film 303 is an anisotropic conductive film, the bridge 108 may be directly coupled with the anisotropic conductive film and use the anisotropic conductive film to provide an electrical pathway between the bridge 108 and dies 102a, 102b (e.g., without using die interconnect structures 106).

The bridge 108 may be embedded in the build-up layers 103 and configured to route electrical signals between the dies 102a, 102b. The electrical routing features 103a may be configured to route electrical signals between the dies 102a, 102b and package-level interconnect structures (e.g., solder balls 113) disposed on side S1 of the build-up layers 103. In some embodiments, the electrical routing features 103a are arranged in a fanout configuration.

According to various embodiments, a thinner bridge 108 or thicker build-up layer may facilitate embedding of the bridge 108 according to FIG. 3f. For example, a bridge 108 having a thickness less than or equal to 45 microns may be embedded in the build-up layers 103. The bridge 108 may be embedded and have other thicknesses in other embodiments.

Figure 3G:
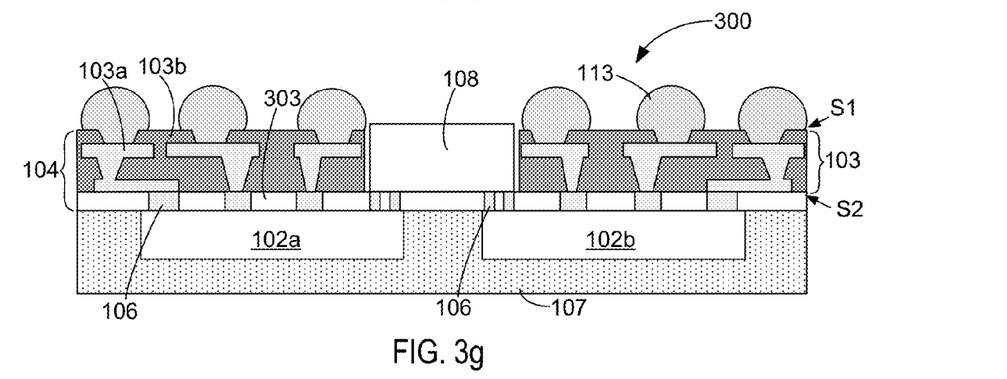

FIG. 3g depicts an alternative arrangement to the IC package assembly 300 of FIG. 3f. In FIG. 3g, the IC package assembly 300 is depicted subsequent to forming build-up layers 103 on the die attach film 303, coupling a bridge 108 with the dies 102a, 102b, and forming package-level interconnect structures (e.g., solder balls 113) on the build-up layers 103. In embodiments according to FIG. 3g, the bridge 108 may be coupled with the dies 102a, 102b subsequent to forming the build-up layers 103 on the die attach film 303. In some embodiments, the bridge 108 may be coupled with the dies 102a, 102b prior to or subsequent to coupling the package-level interconnect structures with the package substrate 104.

For example, in one embodiment, an opening may be left open during fabrication of the build-up layers 103 to provide a cavity for placement/coupling of the bridge 108 with the dies 102a, 102b. In other embodiments, an opening may be formed through the build-up layers 103 using a patterning process. For example, the build-up layers 103 may be composed of a photosensitive material that is amenable to masking, patterning and etch. In other embodiments, the build-up layers 103 may be patterned using a sacrificial layer or materials that are removed by exposure to heat or chemicals.

According to various embodiments, providing a cavity for attachment of the bridge 108 may be performed for an IC package assembly 300 that has a thicker bridge 108 or thinner build-up layer relative to the IC package assembly 300 of FIG. 3f.

Figure 3H:
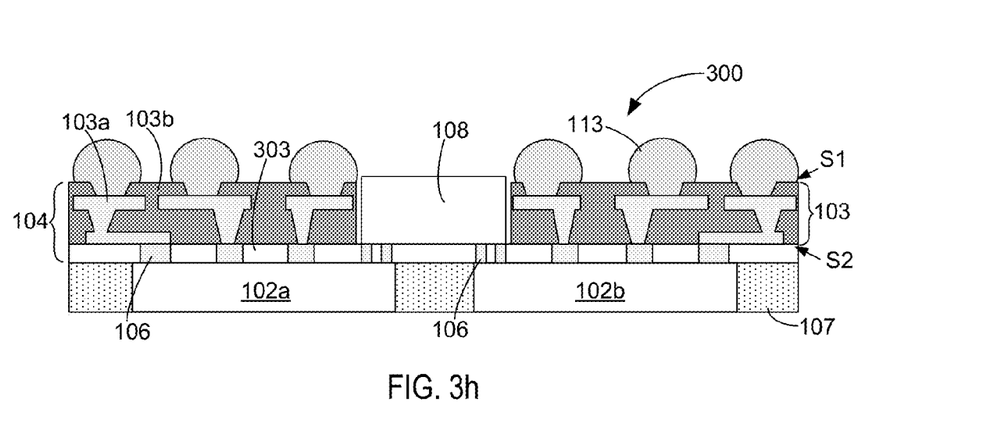

FIG. 3h depicts the IC package assembly 300 of FIG. 3g subsequent to planarizing the electrically insulative material 107 to expose a surface of the dies 102a, 102b, as can be seen. The electrically insulative material 107 may be planarized using, for example, a CMP process. The exposed dies 102a, 102b may facilitate heat transfer away from the dies 102a, 102b in some embodiments. A similar technique may be used to expose the dies 102a, 102b of other package configurations described herein including, for example, the IC package assembly 300 of FIG. 3f.

In some embodiments, the fabrication of the IC package assembly 300 may further include forming a solder mask layer (e.g., solder mask layer 105 of FIG. 1) composed of a glass material. The solder mask layer may be formed, for example, by coupling a thin sheet of glass to an outermost build-up layer of the build-up layers 103 (e.g., side S1 of the build-up layers 103) and forming openings (e.g., opening 109 of FIG. 1). The solder mask layer may be formed prior to or subsequent to coupling the bridge 108 with the dies 102a, 102b, according to various embodiments. In some embodiments (e.g., IC package configuration 300 of FIG. 3f), the solder mask layer may be formed subsequent to coupling the bridge 108 with the dies 102a, 102b and forming the build-up layers 103 and prior to coupling the package-level interconnect structures (e.g., solder balls 113). In other embodiments (e.g., IC package configuration 300 of FIG. 3g), the solder mask layer may be formed prior to coupling the bridge 108 with the dies 102a, 102b and coupling the package-level interconnect structures and subsequent to forming the build-up layers 103.

Figure 4:
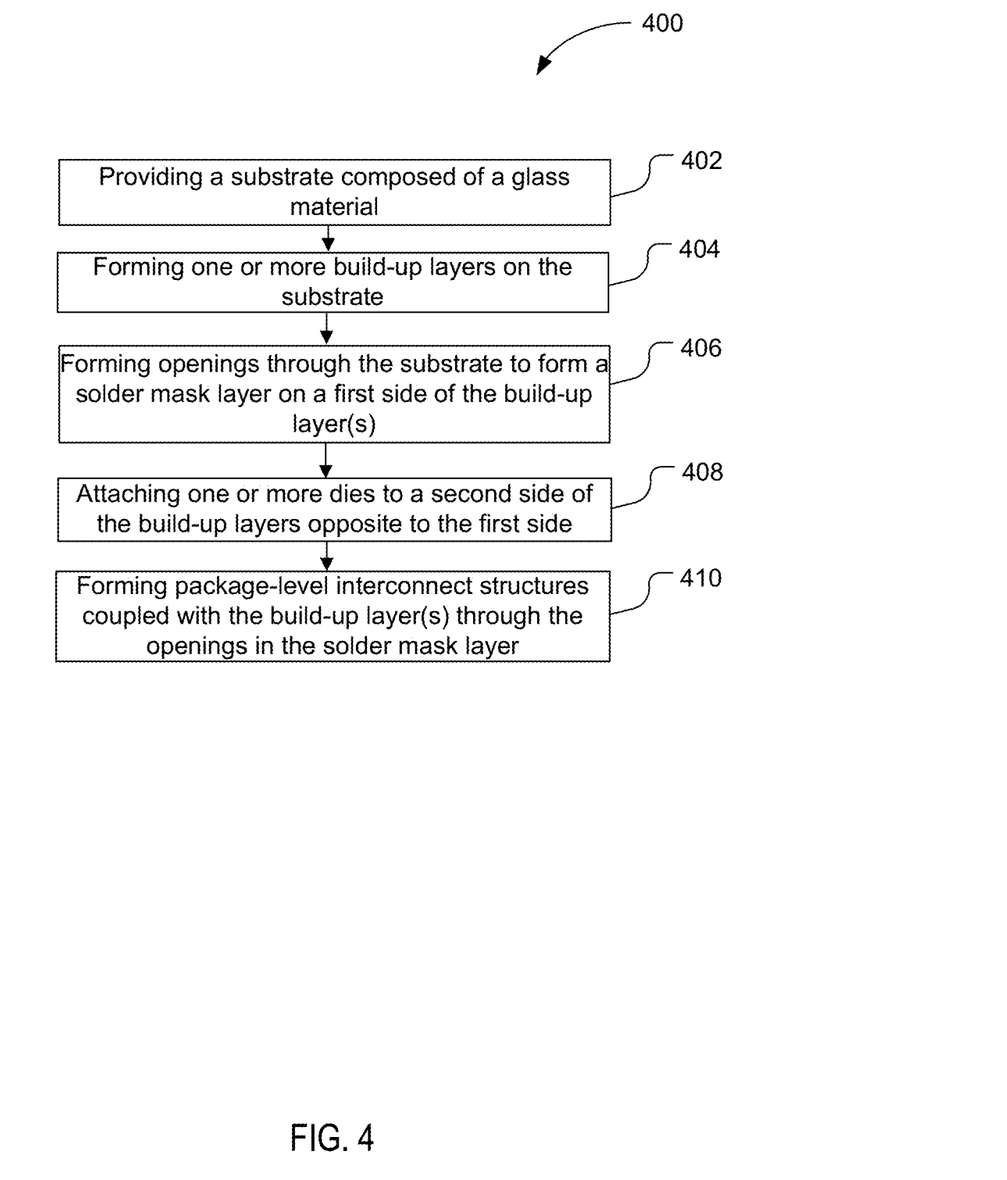
FIG. 4 schematically illustrates a flow diagram for a method of fabricating an IC package assembly including a solder mask layer composed of a glass material, in accordance with some embodiments.

FIG. 4 schematically illustrates a flow diagram for a method 400 of fabricating an IC package assembly (e.g., IC package assembly 200 of FIGS. 2a-g) including a solder mask layer (e.g., solder mask layer 105 of FIGS. 2a-g). The method may comport with embodiments described in connection with FIGS. 2a-g according to various embodiments.

At 402, the method 400 may include providing a substrate composed of a glass material. The substrate may, for example, include a sheet of glass that is configured to serve as a solder mask layer (e.g., solder mask layer 105 of FIG. 2a) of a package substrate (e.g., package substrate 104 of FIG. 2a).

At 404, the method 400 may include forming one or more build-up layers (e.g., build-up layers 103 of FIG. 2a) on the substrate. The build-up layer(s) may include electrical routing features (e.g., electrical routing features 103a) disposed in electrically insulative material (e.g., electrically insulative material 103b). In some embodiments, the build-up layers are formed by depositing a metal on the substrate, patterning the metal to define one or more of the electrical routing features and depositing a laminate material on the patterned metal. The build-up layers may be formed according to techniques described in connection with FIG. 2a or other well-known techniques.

At 406, the method 400 may include forming openings (e.g., opening 109 of FIG. 2f) through the substrate to form a solder mask layer on a first side (e.g., side S1 of FIG. 2f or 2g) of the build-up layer(s). In some embodiments, forming the openings includes performing a wet etch process to remove portions of the glass material. The openings may be formed according to techniques described in connection with FIG. 2f. The openings may allow coupling of one or more package-level interconnect structures (e.g., solder balls 113) with the electrical routing features in the build-up layer(s) through the openings.

At 408, the method 400 may include attaching one or more dies (e.g., dies 102a, 102b of FIG. 2c) to a second side (e.g., side S2 of FIG. 2c) of the build-up layers opposite to the first side. In some embodiments, attaching the die(s) forms an electrical connection between the die(s) and the electrical routing features of the buildup layer(s). The dies may be attached according to techniques described in connection with FIGS. 2b and 2c.

At 410, the method 400 may include forming package-level interconnect structures (e.g., solder balls 113 of FIG. 2f or LGA structures 213 of FIG. 2g) coupled with the build-up layer(s) through the openings in the solder mask layer. The package-level interconnect structures may be formed by depositing electrically conductive material such as metal, solderable material, or combinations thereof. In some embodiments, the package-level interconnect structures may include BGA or LGA structures. The package-level interconnect structures may be formed according to techniques described in connection with FIGS. 2f and 2g.

The method 400 may include other suitable actions including other embodiments described in connection with FIGS. 2a-g or FIGS. 3a-h. For example, the method 400 may further include forming a molding compound by depositing electrically insulative material (e.g., electrically insulative material 107 of FIG. 2d) to at least partially encapsulate one or more of the die(s), electrically coupling the die(s) with a bridge (e.g., bridge 108 of FIG. 1) composed of glass or silicon, or using a temporary carrier for fabrication of the IC package assembly. For example, the substrate may be coupled with a temporary carrier (e.g., temporary carrier 216 of FIG. 2a) prior to forming the build-up layer(s) and the substrate may be decoupled from the temporary carrier subsequent to forming the one or more build-up layers, attaching the one or more dies and forming the molding compound.

Figure 5:
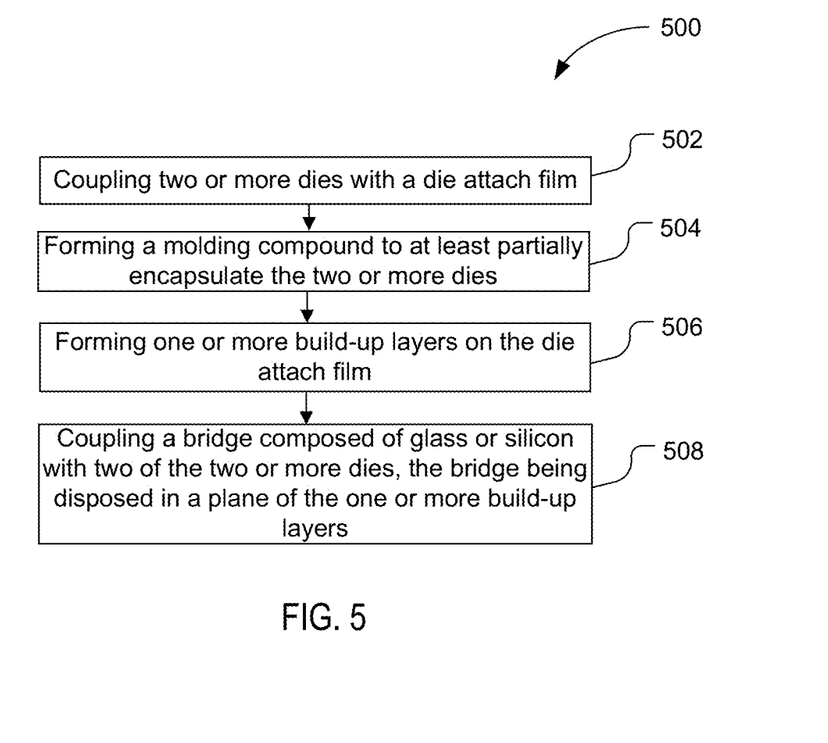
FIG. 5 schematically illustrates a flow diagram for a method of fabricating an IC package assembly including a bridge, in accordance with some embodiments.

FIG. 5 schematically illustrates a flow diagram for a method 500 of fabricating an IC package assembly (e.g., IC package assembly 300 of FIGS. 3a-h) including a bridge (e.g., bridge 108 of FIGS. 3f-h), in accordance with some embodiments. The method 500 may comport with embodiments described in connection with FIGS. 3a-h according to various embodiments.

At 502, the method 500 may include coupling two or more dies (e.g., dies 102a, 102b of FIG. 3b) with a die attach film (e.g., die attach film 303 of FIG. 3b). The dies may be coupled according to techniques described in connection with FIG. 3b. In some embodiments, the die attach film may be coupled with a temporary carrier (e.g., temporary carrier 216 of FIG. 3a) prior to coupling the two or more dies with the die attach film.

At 504, the method 500 may include forming a molding compound (e.g., electrically insulative material 107 of FIG. 3c) to at least partially encapsulate the two or more dies. The molding compound may be deposited according to techniques described in connection with FIG. 3c. In some embodiments, the temporary carrier may be decoupled from the die attach film subsequent to forming the molding compound.

At 506, the method 500 may include forming one or more build-up layers on the die attach film. The die attach film (together with other structural components such as, for example, the dies and/or molding compound) may serve as a substrate upon which the build-up layer(s) are formed. The build-up layer(s) may be formed according to techniques described in connection with FIG. 3f or 3g.

At 508, the method 500 may include coupling a bridge (e.g., bridge 108 of FIG. 3f or 3g) composed of glass or silicon with two of the two or more dies, the bridge being disposed in a plane of the one or more build-up layers. In some embodiments, coupling the bridge may be performed prior to or during formation of the build-up layer(s) such that the bridge is embedded in the build-up layer(s) (e.g., the IC package assembly 300 of FIG. 3f). In other embodiments, coupling the bridge may be performed subsequent to forming the build-up layer(s) such that the bridge is exposed (e.g., the IC package assembly 300 of FIG. 3g). For example, an opening (e.g., cavity) may be formed through the build-up layers and the bridge may be coupled with the dies through the opening, the bridge being disposed in the opening.

The method 500 may include other suitable actions including other embodiments described in connection with FIGS. 2a-g or FIGS. 3a-h. For example, the method 500 may further include forming a solder mask layer composed of a glass material on the build-up layers (e.g., on side S1 of the build-up layers 103 of FIG. 3f), forming openings through the solder mask layer and/or forming package-level interconnect structures electrically coupled with the build-up layer(s) (e.g., through the solder mask layer).

Various operations are described as multiple discrete operations in turn, in a manner that is most helpful in understanding the claimed subject matter. However, the order of description should not be construed as to imply that these operations are necessarily order dependent. For example, actions of the method 400 or 500 may be performed in another suitable order than depicted.

Figure 6:
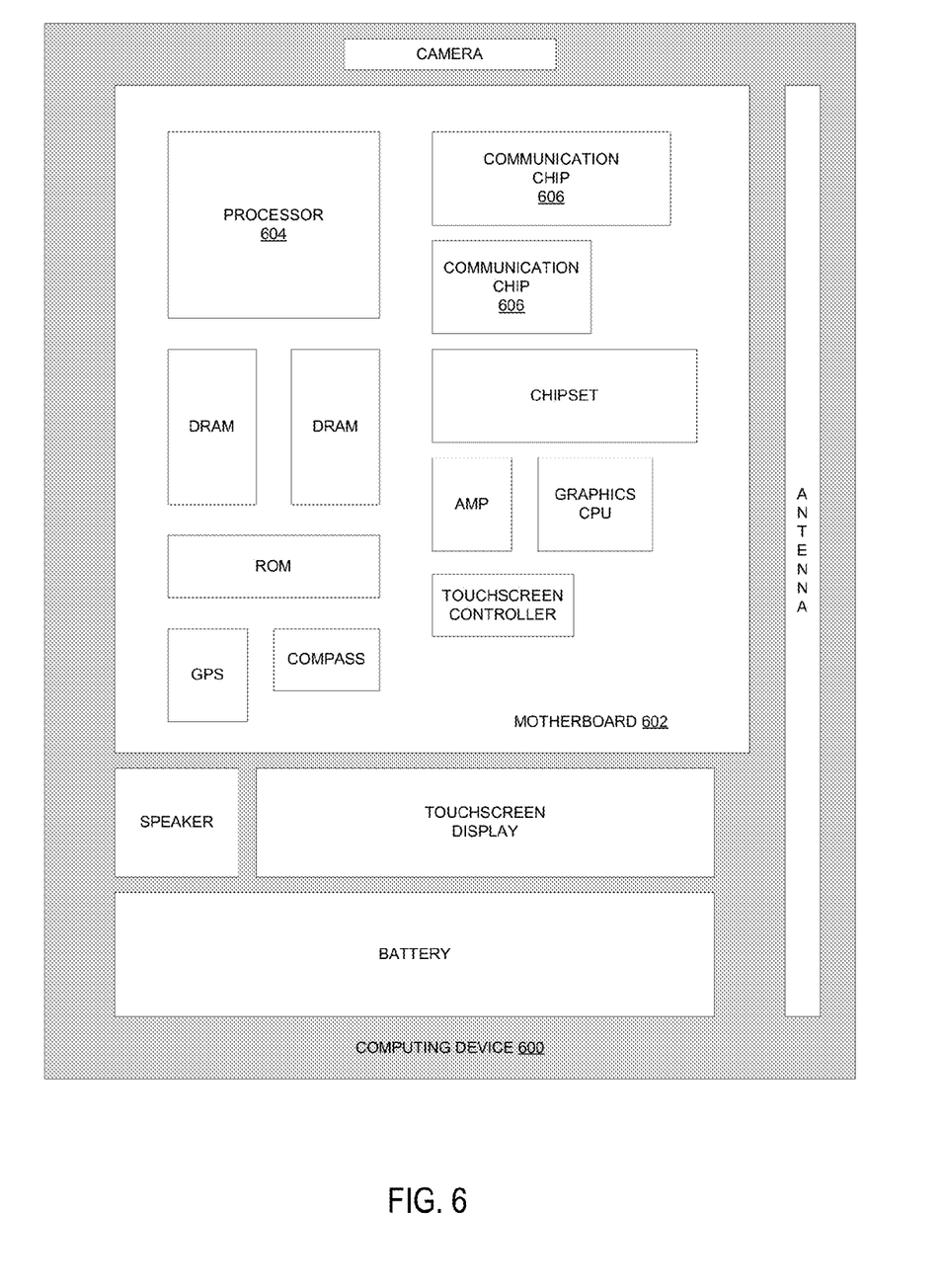
FIG. 6 schematically illustrates a computing device that includes an IC package assembly as described herein, in accordance with some embodiments.

Embodiments of the present disclosure may be implemented into a system using any suitable hardware and/or software to configure as desired. FIG. 6 schematically illustrates a computing device 600 that includes an IC package assembly (e.g., IC package assembly 100 of FIG. 1) as described herein, in accordance with some embodiments. The computing device 600 may house a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 may be packaged in an IC assembly (e.g., IC package assembly 100 of FIG. 1) that includes a solder mask layer (e.g., solder mask layer 105 of FIG. 1) and/or bridge (e.g., bridge 108 of FIG. 1) as described herein. For example, the circuit board 122 of FIG. 1 may be a motherboard 602 and the processor 604 may be a die 102a mounted on a package substrate 104 of FIG. 1. The package substrate 104 and the motherboard 602 may be coupled together using package-level interconnect structures 112. The term "processor" may refer to any device or portion of a device that processes electronic data from registers and/or memory to transform that electronic data into other electronic data that may be stored in registers and/or memory.

The communication chip 606 may also include a die (e.g., die 102a of FIG. 1) that may be packaged in an IC assembly (e.g., IC package assembly 100 of FIG. 1) as described herein. In further implementations, another component (e.g., memory device or other integrated circuit device) housed within the computing device 600 may include a die (e.g., die 102a of FIG. 1) that may be packaged in an IC assembly (e.g., IC package assembly 100 of FIG. 1) as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

According to various embodiments, the present disclosure describes an apparatus (e.g., IC package assembly) comprising one or more build-up layers having electrical routing features and a solder mask layer composed of a glass material, the solder mask layer being coupled with the one or more build-up layers and having openings disposed in the solder mask layer to allow coupling of package-level interconnect structures with the electrical routing features through the one or more openings. In some embodiments, the glass material is optically transparent, includes silica and has a coefficient of thermal expansion (CTE) from 3 to 7. In some embodiments, a pitch between two of the openings is less than or equal to 400 microns.

In some embodiments, the solder mask layer is coupled with a first side of the one or more build-up layers, the apparatus further comprising a die coupled with a second side of the one or more build-up layers, the second side being disposed opposite to the first side, wherein the electrical routing features are configured to route electrical signals of the die through the one or more build-up layers. In some embodiments, the die is a first die and the electrical routing features are first electrical routing features, the apparatus further comprising a second die coupled with the first die or the second side of the one or more build-up layers, wherein the one or more build-up layers include second electrical routing features that are configured to route electrical signals of the second die through the one or more build-up layers. In some embodiments, the second die is coupled with the second side of the one or more build-up layers, the apparatus further comprising a bridge composed of glass or silicon disposed in a plane formed by the one or more build-up layers, the bridge being configured to route electrical signals between the first die and the second die.

In some embodiments, the apparatus further includes a molding compound configured to at least partially encapsulate the die and the package-level interconnect structures, wherein the package-level interconnect structures include ball-grid array (BGA) or land-grid array (LGA) structures coupled with the first side of the one or more build-up layers through the openings.

According to various embodiments, the present disclosure describes a method comprising providing a substrate composed of a glass material, forming one or more build-up layers on the substrate, the one or more build-up layers having electrical routing features and forming openings through the substrate to form a solder mask layer composed of the glass material to allow coupling of one or more package-level interconnect structures with the electrical routing features through the openings.

In some embodiments, forming the one or more build-up layers comprises depositing a metal on the substrate, patterning the metal to define one or more of the electrical routing features and depositing a laminate material on the patterned metal. In some embodiments, the substrate is coupled with a first side of the one or more build-up layers, the method further comprising attaching one or more dies with a second side of the one or more build-up layers, wherein attaching the one or more dies forms an electrical connection between the one or more dies and the electrical routing features of the one or more build-up layers.

In some embodiments, the method further includes forming a molding compound to at least partially encapsulate the one or more dies. In some embodiments, the method further includes coupling the substrate with a temporary carrier prior to forming the one or more build-up layers and decoupling the temporary carrier from the substrate subsequent to forming the one or more build-up layers, attaching the one or more dies and forming the molding compound.

In some embodiments, attaching the one or more dies further comprises attaching a first die and a second die with the second side of the one or more build-up layers and electrically coupling the first die and the second die with a bridge composed of glass or silicon, the bridge being disposed in a plane formed by the one or more build-up layers and being configured to route electrical signals between the first die and the second die. In some embodiments, forming the openings comprises performing a wet etch process to remove portions of the glass material.

In some embodiments, the method further includes depositing electrically conductive material to form the package-level interconnect structures, wherein the package-level interconnect structures are electrically coupled with the electrical routing features of the one or more build-up layers through the openings.

According to various embodiments, the present disclosure describes another method comprising coupling a first die and a second die with a die attach film, forming a molding compound to at least partially encapsulate the first die and the second die, forming one or more build-up layers on the die attach film, the one or more build-up layers having electrical routing features configured to route electrical signals of the first die and the second die through the one or more build-up layers and coupling a bridge composed of glass or silicon with the first die and the second die to route electrical signals between the first die and the second die, the bridge being disposed in a plane of the one or more build-up layers.

In some embodiments, coupling the bridge is performed prior to forming the one or more build-up layers such that the bridge is embedded in the one or more build-up layers. In some embodiments, coupling the bridge is performed subsequent to forming the one or more build-up layers, the method further comprising forming an opening through the one or more build-up layers, wherein the bridge is disposed in the opening.

In some embodiments, the method further includes coupling the die attach film with a temporary carrier prior to coupling the first die and the second die with the die attach film and decoupling the temporary carrier from the die attach film subsequent to forming the molding compound. In some embodiments, the method further includes forming a solder mask layer composed of a glass material on the one or more build-up layers. In some embodiments, the method further includes forming one or more package-level interconnect structures, wherein the package-level interconnect structures are electrically coupled with the electrical routing features of the one or more build-up layers through the solder mask layer.

According to various embodiments, the present disclosure describes a system (e.g., computing device) comprising a package substrate including one or more build-up layers having one or more electrical routing features, and a solder mask layer composed of a glass material, the solder mask layer being coupled with a first side of the one or more build-up layers and having one or more openings disposed in the solder mask layer, a die coupled with a second side of the one or more build-up layers, the second side being disposed opposite to the first side, wherein the electrical routing features are configured to route electrical signals of the die through the one or more build-up layers and a circuit board coupled with first side of the one or more build-up layers using package-level interconnect structures that are coupled with the electrical routing features through the openings in the solder mask layer.

In some embodiments, the die is a first die and the electrical routing features are first electrical routing features, the system further comprising a second die coupled with the second side of the one or more build-up layers, wherein the one or more build-up layers include second electrical routing features that are configured to route electrical signals of the second die through the one or more build-up layers and a bridge composed of glass or silicon disposed in a plane formed by the one or more build-up layers, the bridge being configured to route electrical signals between the first die and the second die. In some embodiments, the system further includes one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the system is one of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
    one or more build-up layers having electrical routing features, wherein a first material of the one or more build-up layers has a first coefficient of thermal expansion (CTE);
    a die coupled with a first side of the one or more build-up layers;
    a molding compound to at least partially encapsulate the die, wherein a second material of the molding compound has a second CTE;
    a solder mask layer of a third material that is different from the first material of the one or more build-up layers and the second material of the molding compound and has a third CTE that corresponds to at least one of the first CTE or the second CTE, wherein the solder mask layer of the third material includes a sheet of glass composed of silica or quartz, the sheet of glass being coupled with a second side of the one or more build-up layers and having openings disposed in the sheet of glass layer to allow coupling of package-level interconnect structures with the electrical routing features through the openings, wherein the silica or quartz has a CTE from 3 to 7 and the sheet of glass has a thickness of the silica or quartz ranging from 15 microns to 50 microns, the second side being disposed opposite to the first side;
    wherein a pitch between two of the openings is less than or equal to 400 microns; and
    an opening of the openings has a diameter between 100 and 300 microns.

2. The apparatus of claim 1, wherein the silica or quartz is optically transparent.

3. The apparatus of claim 1, wherein the electrical routing features are to route electrical signals of the die through the one or more build-up layers.

4. The apparatus of claim 3, wherein the die is a first die and the electrical routing features are first electrical routing features, the apparatus further comprising:
    a second die coupled with the first die or the second side of the one or more build-up layers, wherein the one or more build-up layers include second electrical routing features that are to route electrical signals of the second die through the one or more build-up layers.

5. The apparatus of claim 4, wherein the second die is coupled with the second side of the one or more build-up layers.

6. The apparatus of claim 3, further comprising:
    the package-level interconnect structures, wherein the package-level interconnect structures include ball-grid array (BGA) or land-grid array (LGA) structures coupled with the first side of the one or more build-up layers through the openings.

7. A method comprising:
    providing a sheet of glass composed of a first material, wherein the first material is silica or quartz;
    forming a package substrate, including forming one or more build-up layers on the sheet of glass, the one or more build-up layers having electrical routing features and wherein a first side of the one or more build-up layers is directly coupled with the sheet of glass;
    forming openings through the sheet of glass to form a solder mask layer composed of the first material to allow coupling of one or more package-level interconnect structures with the electrical routing features through the openings, wherein the first material has a first coefficient of thermal expansion (CTE) from 3 to 7 and the sheet of glass has a thickness of the silica or quartz ranging from 15 microns to 50 microns; and
    attaching one or more dies with a second side of the one or more build-up layers, the second side opposite the first side of the build-up layers, the one or more dies including a second semiconductor material that is different from the first material and has a second CTE;
    wherein a pitch between two of the openings is less than or equal to 400 microns;
    an opening of the openings has a diameter between 100 and 300 microns; and
    wherein the first CTE of the first material is selected to correspond to a third CTE of a third material of a component of the package substrate, wherein the third material is different from the first material, and wherein the first CTE corresponds to the second CTE.

8. The method of claim 6, wherein forming the one or more build-up layers comprises:
    depositing a metal on the sheet of glass;
    patterning the metal to define one or more of the electrical routing features; and
    depositing a laminate material on the patterned metal.

9. The method of claim 6, wherein attaching the one or more dies forms an electrical connection between the one or more dies and the electrical routing features of the one or more build-up layers.

10. The method of claim 9, further comprising:
    forming a molding compound to at least partially encapsulate the one or more dies.

11. The method of claim 10, further comprising:
    coupling the sheet of glass with a temporary carrier prior to forming the one or more build-up layers; and
    decoupling the temporary carrier from the sheet of glass subsequent to forming the one or more build-up layers, attaching the one or more dies and forming the molding compound.

12. The method of claim 9, wherein attaching the one or more dies further comprises:
    attaching a first die and a second die with the second side of the one or more build-up layers.

13. The method of claim 7, wherein forming the openings comprises performing a wet etch process to remove portions of the silica or quartz.

14. The method of claim 7, further comprising:
depositing electrically conductive material to form the package-level interconnect structures, wherein the package-level interconnect structures are electrically coupled with the electrical routing features of the one or more build-up layers through the openings.

15. A system comprising:
a package substrate including
one or more build-up layers having electrical routing features, and
a solder mask layer including a sheet of glass composed of a first material, wherein the first material is silica or quartz, the sheet of glass being coupled with a first side of the one or more build-up layers and having openings disposed in the solder mask layer, wherein the first material has a coefficient of thermal expansion (CTE) from 3 to 7 and the sheet of glass has a thickness of the first material ranging from 15 microns to 50 microns;
a die coupled with a second side of the one or more build-up layers, the second side being disposed opposite to the first side, wherein the electrical routing features are to route electrical signals of the die through the one or more build-up layers; and
a circuit board coupled with first side of the one or more build-up layers using package-level interconnect structures that are coupled with the electrical routing features through the openings in the sheet of glass;
wherein a pitch between two of the openings is less than or equal to 400 microns;
an opening of the openings has a diameter between 100 and 300 microns; and
wherein the CTE of the first material corresponds to a CTE of a second material of a component of the package substrate, wherein the second material is different from the first material.

16. The system of claim 15, wherein the die is a first die and the electrical routing features are first electrical routing features, the system further comprising:
a second die coupled with the second side of the one or more build-up layers, wherein the one or more build-up layers include second electrical routing features that are to route electrical signals of the second die through the one or more build-up layers.

17. The system of claim 15, further comprising:
one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board,
wherein the system is one of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

* * * * *